United States Patent [19]

Turner et al.

[11] 3,895,435

[45] July 22, 1975

[54] METHOD FOR ELECTRICALLY INTERCONNECTING MULTILEVEL STRIPLINE CIRCUITRY

[75] Inventors: Kenneth R. Turner, Atkinson, N.H.; James C. Bryanos, Nahant, Mass.

[73] Assignee: Raytheon Company, Lexington, Mass.

[22] Filed: Jan. 23, 1974

[21] Appl. No.: 435,817

[52] U.S. Cl. .......... 29/625; 174/68.5; 174/117 PC; 317/101 B; 333/33; 333/84 M

[51] Int. Cl. .......... H05k 3/00

[58] Field of Search .......... 29/625.6, 628; 174/68.5, 174/117 FF, 117 PC; 317/101 B, 101 CM, 101 CE; 333/33, 84 M, 97 R; 340/174 GB, 174 GP

[56] References Cited

UNITED STATES PATENTS

| | | | |
|---|---|---|---|
| 3,243,498 | 3/1966 | Allen et al. | 29/626 X |
| 3,348,990 | 10/1967 | Zimmerman et al. | 29/625 X |
| 3,436,819 | 4/1969 | Lunine | 174/68.5 X |
| 3,532,801 | 10/1970 | Faulkner | 29/625 X |
| 3,627,902 | 12/1971 | Meyers et al. | 29/625 X |
| 3,629,730 | 12/1971 | Penzel et al. | 333/84 M X |
| 3,691,632 | 9/1972 | Smith | 29/625 |
| 3,739,469 | 6/1973 | Dougherty | 317/101 CM X |
| 3,740,678 | 6/1973 | Hill | 317/101 CM X |
| 3,760,091 | 9/1973 | Cannizzaro et al. | 174/68.5 |
| 3,792,383 | 2/1974 | Knappenberger | 317/101 CM X |

*Primary Examiner*—Richard J. Herbst
*Assistant Examiner*—Joseph A. Walkowski
*Attorney, Agent, or Firm*—Richard M. Sharkansky; Philip J. McFarland; Joseph D. Pannone

[57] ABSTRACT

A method for electrically interconnecting multilevel stripline circuitry is disclosed. The circuitry includes strip center conductors on dielectric panels and on different sides of a common inner ground plane, each one of such panels being covered by a different outer ground plane. After bonding the dielectric panels together a hole is formed therethrough, such hole also passing through the strip center conductors and the outer ground planes. The walls of such hole are next plated to effect the desired electrical interconnection between the strip center conductors and are counterbored to separate the outer ground planes from the plating on the walls.

1 Claim, 4 Drawing Figures

METHOD FOR ELECTRICALLY INTERCONNECTING MULTILEVEL STRIPLINE CIRCUITRY

The invention herein described was made in the course of or under a contract or subcontract thereunder, with the Department of Defense.

BACKGROUND OF THE INVENTION

This invention related generally to a method for electrically interconnecting multilevel stripline circuitry.

As is known in the art, stripline circuitry generally comprises a center strip conductor sandwiched between two comparatively wide panels of dielectric material, such panels having their outer surfaces clad with a conductive material to form spaced opposing ground planes. The center strip conductor may be formed on the inner broad wall of one of the panels by printed circuit technology. Then the inner broad surfaces of both panels are bonded together to fuse the center strip conductor symmetrically between the ground planes. Such structure is suitable for passing microwave energy.

It is sometimes desirable to fabricate multilevel stripline circuitry. Such circuitry generally includes four vertically stacked panels of dielectric material. The two outer panels have their outer surfaces clad with a conductive material to form a pair of ground planes. The two inner panels have stripline conductors printed thereon. On one of the two inner panels a conductive material is clad on the surface opposite the surface on which the strip center conductor is printed. Therefore, when assembled, the strip center conductors share a common ground plane (i.e. the ground plane resulting from the conductive material formed on one of the two center dielectric panels), such ground plane being intermediate the pair of strip center conductors. Each outer ground plane provides the second ground plane for a different one of the pair of strip center conductors.

It is frequently desirable to electrically interconnect the pair of strip center conductors in the multilevel stripline circuitry described above. One technique generally used for such electrical interconnection is through the use of mechanical interconnecting devices. Such mechanical interconnecting devices depend on mechanical contact of the strip center conductors in order to provide the electrical interconnection. Therefore, such mechanical interconnecting devices rely on mechanical tolerances of the various parts comprising such device. Further, such devices generally include a mechanical structure which extends beyond the circuitry, making compact packaging of a plurality of multilevel stripline circuitry difficult.

SUMMARY OF THE INVENTION

With this background of the invention in mind it is therefore an object of this invention to provide an improved method for electrically interconnecting the center strip conductors in multilevel stripline circuitry.

This and other objects of the invention are attained generally by: Assembling a multilevel stripline circuit, such circuit including strip center conductors separated from a common inner ground plane and a different outer ground plane by dielectric panels; forming a hole through each one of the panels, such hole passing through the strip center conductors and the outer ground planes; plating the walls of the hole to effect the desired electrical interconnection.

BRIEF DESCRIPTION OF THE DRAWINGS

The above-mentioned and other features of the invention will become more apparent by reference to the following description taken together in conjunction with the accompanying drawings, in which.

DESCRIPTION OF THE PREFERRED EMBODIMENT

Figures 1, 2, 3:
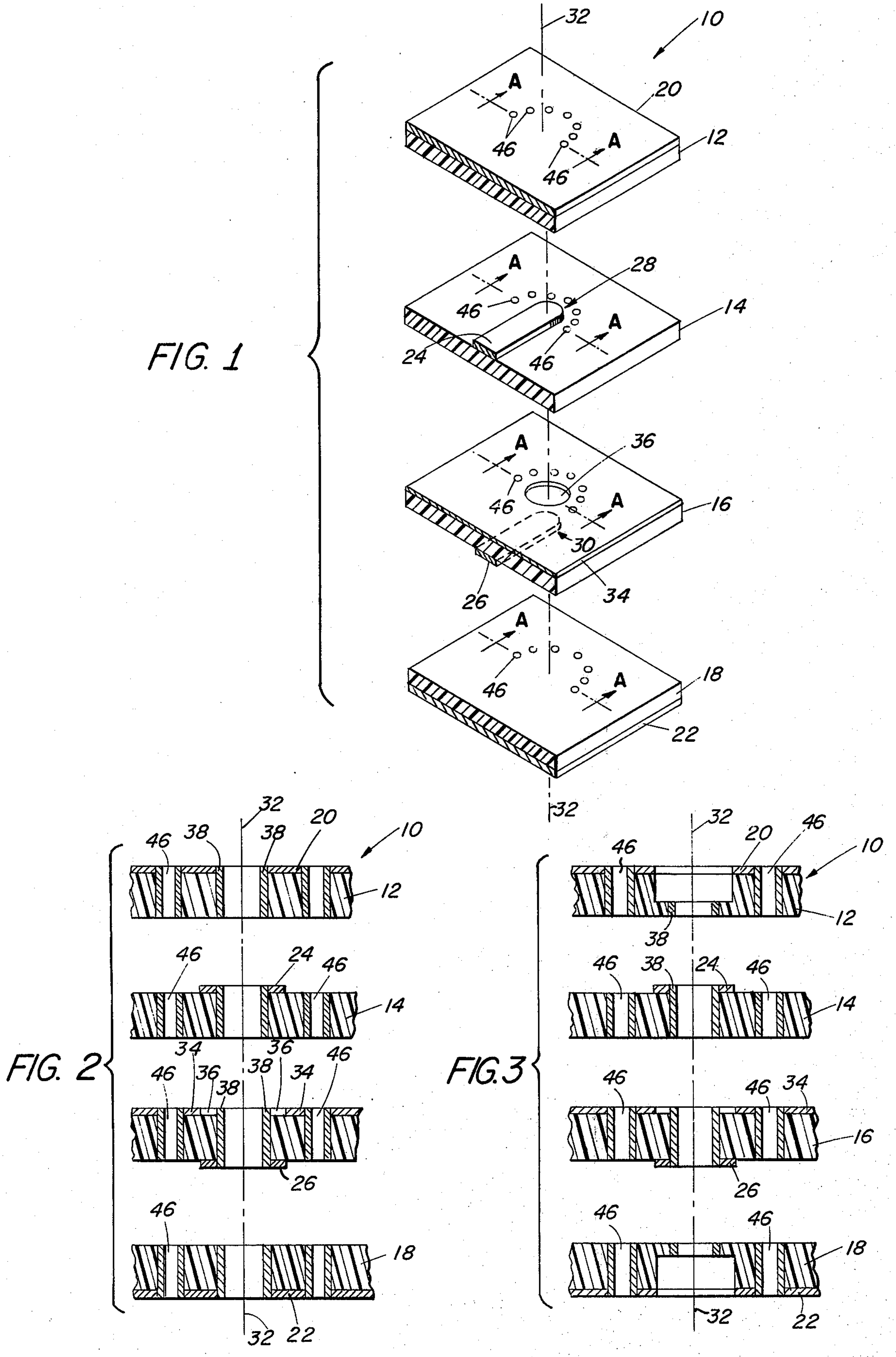
FIG. 1 is a cutaway, exploded, isometric drawing, somewhat distorted, showing each one of four panels of multilevel stripline circuitry, partially processed according to the invention; and, FIGS. 2, 3 and 4 are cross-sectional views, taken along the plane marked A—A, of the stripline circuitry of FIG. 1 after further processing according to the invention.

Referring now to FIG. 1, a portion of a multilevel stripline circuit 10 is shown to comprise four vertically stacked panels 12, 14, 16 and 18, each being of a dielectric material, here the material designated Duroid 5880, produced by Rogers Corp., Rogers, Conn. The two outer panels 12, 18 have deposited thereon a suitable conductive material 20 and 22 (here copper) respectively to form "outer ground planes." Such copper is deposited by conventional high temperature, high pressure bonding techniques. The two inner panels 14, 16 have strip center conductors 24, 26, here made of copper, printed thereon using conventional photoresist-etching techniques. The ends 28, 30 of such strip center conductors 24, 26 are aligned along an axis 32. The alignment is made by punching reference holes (not shown) on the dielectric panels, such holes corresponding to reference marking on the masks used during photoresist-etching of the strip center conductors 24, 26. Inner panel 16 also has disposed on a surface thereof a suitable conductive material 34, here copper, to form an "inner" ground plane with an opening 36 disposed symmetrically about axis 32. The four panels 12, 14, 16, 18 are bonded together by depositing a suitable bonding film on the surfaces to be bonded and exposing the circuit and the bonding film to appropriate temperature and pressure to effectuate the bond.

After the dielectric panels 12, 14, 16, 18 are bonded a hole is drilled along axis 32 through each one of the dielectric panels. Such drilled hole passes through the outer conductive materials 20, 22 and dielectric materials 12, 14, 16 and 18. The alignment of such hole is made by use of the reference holes (not shown). It is noted that the diameter of such drilled hole is less than the diameter of the opening 36 in the conductive material 34.

Referring now also to FIG. 2, the walls of the drilled hole next are plated with suitable conductive plating materials. The plating is performed in two steps. First, a conventional "electroless" copper deposition plating process is used to deposit a coating of copper particles on the inner walls of the drilled hole including a portion of the bonding film which remains in the opening 36. Next an electroplating process is used to plate a layer of conducting material, here also copper, to build the plating on the inner walls of the drilled hole to a desired thickness. The just described plating process results in the formation of a pin 38 of conductive material which effectuates an electrical interconnection between the outer ground plane conductive materials 20, 22 and the strip center conductors 24, 26. It is noted that because of the circular opening 36, no electrical connection is made between the pin 38 and the conductive material 34.

Referring now to FIG. 3, a portion of the pin 38 is removed from the outer ground plane conductive materials 20, 22 so that the interconnections between the ground plane conductive materials 20, 22 and such pin 38 are broken. Here portions of the pin 38 are removed by counterboring the drilled hole along axis 32 to a depth in the dielectric panels 12, 22 greater than the thickness of the outer ground plane conductive materials 20, 22. After such counterbores, the pin 38, while providing an electrical interconnection between the strip center conductors 24, 26, is electrically insulated from the ground plane materials 20, 22. Hence a multilevel stripline circuit is formed wherein an electrical interconnection is complete between two strip center conductors, such conductors each being electrically separated from a pair of ground planes by a dielectric panel.

Figure 4:
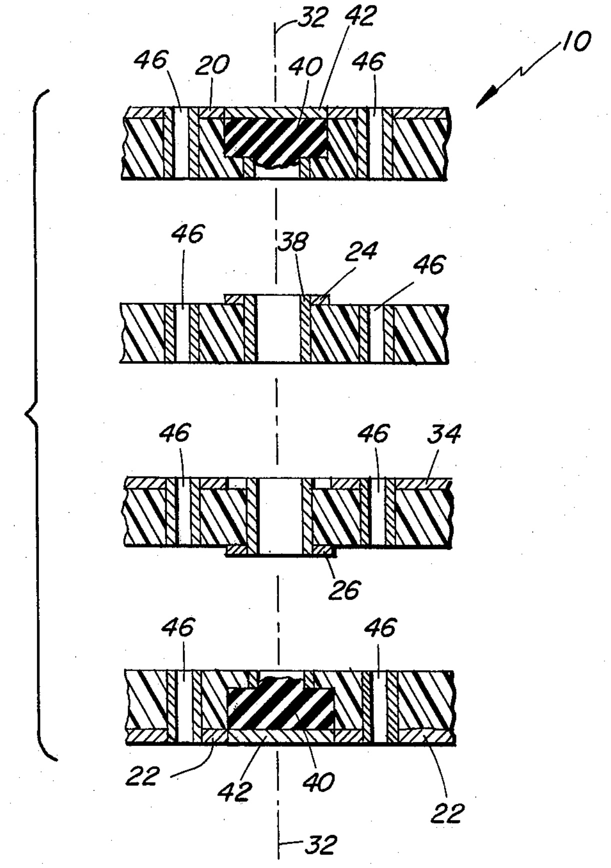

While the process described above provides an adequate electrical interconnection between the pair of strip center conductors 24, 26, it may be desirable for the multilevel stripline circuit 10 to have a continuous "outer" ground plane conductive material. To accomplish this a dielectric material 40, as a suitable dielectric epoxy, is disposed in the counterbore between the lower surface of the ground plane conducting materials 20, 22 and the ends of the plated walls of the drilled hole as shown in FIG. 4. Next a conductive material 42, as a suitable conductive epoxy, is disposed to overlay the dielectric material 40. The outer surfaces of such conductive material 42 and of conductive materials 20, 22 are then smoothed to form continuous outer ground planes.

Referring to FIGS. 1–4, a number of holes are drilled through the bonded panels 12, 14, 16, 18 parallel to axis 32. Such holes 46 pass through the conductive materials 20, 22, 34 and the dielectric materials of the panels 12, 14, 16, 18. It is noted that such holes 46 do not pass through the strip center conductors 24, 26. The plating process described above is used to plate inner walls of the just-mentioned drilled holes 46 to electrically interconnect the three ground planes (i.e. conductive materials 20, 22, 34). Such electrical interconnections serve as a mode suppression cavity around the strip center conductor interconnection "pin," to suppress radio frequency reflections which may be produced as such energy passes between the strip center conductors and the interconnecting pin 38.

Having described a preferred embodiment of this invention, it is evident that other embodiments incorporating its concepts may be used. It is felt, therefore, that this invention should not be restricted to such preferred embodiment but rather should be limited only by the spirit and scope of the appended claims.

What is claimed is:

1. A method for electrically interconnecting multilevel stripline circuitry, said circuitry including strip center conductors separated from a common inner ground plane and a different outer ground plane by dielectric panels, the steps comprising:

a. forming a hole through the dielectric panels, such hole passing through the common inner ground plane, strip center conductors and the outer ground planes, said inner ground plane having an aperture concentric with and larger than said hole to thereby electrically isolate said inner ground plane from said hole;

b. plating the walls of the formed hole with an electrically conductive plating material to effect an interconnection between the strip center conductors as well as the outer ground planes;

c. counterboring a portion of the electrically conductive material after the plating step to form isolation regions between the outer ground planes and the conductive material;

d. filling the isolation regions with a dielectric material;

e. depositing a conductive material over the dielectric material filling the isolation regions to form continuous outer ground planes.

* * * * *